US012581885B2

(12) United States Patent
Kobayashi

(10) Patent No.: US 12,581,885 B2
(45) Date of Patent: Mar. 17, 2026

(54) PROCESSING METHOD OF WAFER REMOVING PERIPHERAL PORTION OF WAFER

(71) Applicant: DISCO CORPORATION, Tokyo (JP)

(72) Inventor: Satoshi Kobayashi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 345 days.

(21) Appl. No.: 18/452,772

(22) Filed: Aug. 21, 2023

(65) Prior Publication Data

US 2024/0079243 A1     Mar. 7, 2024

(30) Foreign Application Priority Data

Sep. 5, 2022    (JP) ................................. 2022-140655

(51) Int. Cl.
| | |
|---|---|
| H10P 52/00 | (2026.01) |
| B23K 26/38 | (2014.01) |
| B23K 26/53 | (2014.01) |
| H10P 34/42 | (2026.01) |
| H10P 90/00 | (2026.01) |
| H10W 10/10 | (2026.01) |

(52) U.S. Cl.
CPC .............. *H10P 52/00* (2026.01); *B23K 26/38* (2013.01); *B23K 26/53* (2015.10); *H10P 34/42* (2026.01); *H10P 90/1914* (2026.01); *H10W 10/181* (2026.01)

(58) Field of Classification Search
CPC ................. H01L 21/304; H01L 21/268; H01L 21/76251; H01L 21/78; B23K 26/38; B23K 26/53; H10P 52/00; H10P 34/42; H10P 90/1914
See application file for complete search history.

(56) References Cited

U.S. PATENT DOCUMENTS

| | | | |
|---|---|---|---|
| 2020/0027773 A1* | 1/2020 | Lin .......................... | H01L 21/78 |
| 2022/0250190 A1* | 8/2022 | Tanoue ................... | B23K 26/53 |

FOREIGN PATENT DOCUMENTS

| | | |
|---|---|---|
| JP | 2007158239 A | 6/2007 |
| JP | 2020057709 A | 4/2020 |

* cited by examiner

*Primary Examiner* — John P. Dulka
(74) *Attorney, Agent, or Firm* — Green Burns & Crain Ltd.

(57) ABSTRACT

A wafer is processed by causing a cutting blade to cut into an outer circumferential surplus region of a first wafer from the front surface side by a predetermined thickness and executing cutting along the outer circumferential edge to form an annular step part in the outer circumferential surplus region, bonding the front surface side of the first wafer and the front surface side of a second wafer to form a bonded wafer, forming an annular modified layer by positioning the focal point of a laser beam with a wavelength having transmissibility with respect to the first wafer to the inside of the first wafer and executing irradiation with the laser beam along the boundary between a device region and the outer circumferential surplus region from the back surface side, and grinding the back surface side of the first wafer to execute thinning to a predetermined finished thickness.

5 Claims, 11 Drawing Sheets

1

PROCESSING METHOD OF WAFER REMOVING PERIPHERAL PORTION OF WAFER

BACKGROUND OF THE INVENTION

Field of the Invention

The present invention relates to a processing method of a wafer.

Description of the Related Art

Along with reduction in a height and enhancement in a degree of integration regarding device chips in recent years, development of a semiconductor wafer three-dimensionally stacked has been advanced. For example, a through-silicon via (TSV) wafer enables, by a through-electrode, connection of electrodes of two chips through bonding of both chips to each other.

Such a wafer is ground to be thinned in a state in which the wafer is bonded to a support wafer (silicon, glass, ceramic, or the like) that serves as a base. In general, an outer circumferential edge is chamfered in the wafer. Therefore, when the wafer is ground very thinly, the outer circumferential edge becomes a generally-called knife-edge and chipping at the edge is liable to occur in the grinding. Due to this, there is a possibility that the chipping extends to a device and breakage of the device is caused.

As a countermeasure against the knife-edge, a generally-called edge trimming technique in which the outer circumferential edge of a wafer on the front surface side is annularly cut has been developed (refer to Japanese Patent No. 4895594). Furthermore, an edge trimming method has also been devised in which irradiation with a laser beam is executed along the outer circumferential edge of a device region to form an annular modified layer and thereafter grinding is executed (refer to Japanese Patent Laid-open No. 2020-057709).

SUMMARY OF THE INVENTION

However, the method of Japanese Patent No. 4895594 involves problems that an amount of consumption of an abrasive stone is large and the cost is high and that uneven wear occurs in a cutting blade. Moreover, in the method of Japanese Patent Laid-open No. 2020-057709, an adhesive layer that bonds wafers exists also in the vicinity of an outer circumferential part and therefore a region on the side of the outer circumferential part relative to the modified layer annularly formed remains adhering and it is impossible to remove this region well in some cases. If the outer circumferential region remains, there are a possibility that a region on the outside relative to the annular modified layer and a region on the inside collide with each other and break and a possibility that a polishing pad is damaged in a subsequent polishing step.

Thus, an object of the present invention is to provide a processing method of a wafer that can reduce the possibility of breakage of the wafer while suppressing the amount of consumption of an abrasive stone.

In accordance with an aspect of the present invention, there is provided a processing method of a wafer. The processing method of a wafer includes a trimming step of causing a cutting blade to cut into an outer circumferential surplus region of a first wafer having, on the front surface side, a device region in which a plurality of devices are formed and the outer circumferential surplus region that surrounds the device region from the front surface side of the first wafer by a predetermined thickness and executing cutting along an outer circumferential edge of the first wafer to form an annular step part in the outer circumferential surplus region and a bonding step of bonding the front surface side of the first wafer and a front surface side of a second wafer to form a bonded wafer after the trimming step is executed. The processing method of a wafer includes also an annular modified layer forming step of forming an annular modified layer along the boundary between the outer circumferential surplus region that has not been removed in the trimming step in the first wafer and the device region by positioning the focal point of a laser beam with a wavelength having transmissibility with respect to the first wafer to the inside of the first wafer and executing irradiation with the laser beam along the boundary between the device region and the outer circumferential surplus region from the back surface side of the first wafer after the bonding step is executed and a grinding step of grinding the back surface side of the first wafer to execute thinning to a predetermined finished thickness after the annular modified layer forming step is executed.

Preferably, the processing method of a wafer further includes an auxiliary modified layer forming step of irradiating the outer circumferential surplus region on the outer circumferential edge side relative to the annular modified layer in the first wafer with a laser beam and forming an auxiliary modified layer that segments the outer circumferential surplus region into at least two regions before the grinding step.

Preferably, the processing method of a wafer further includes an outer circumferential surplus region removal step of giving an external force to the outer circumferential surplus region that has not been removed in the trimming step in the first wafer and removing the outer circumferential surplus region with use of the annular modified layer as a point of origin before the grinding step.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by contents described in the following embodiment. Furthermore, what can be easily envisaged by those skilled in the art and what are substantially the same are included in constituent elements described below. Moreover, configurations described below can be combined as appropriate. In addition, various kinds of omission, replacement, or change of a configuration can be carried out without departing from the gist of the present invention.

Figure 1:
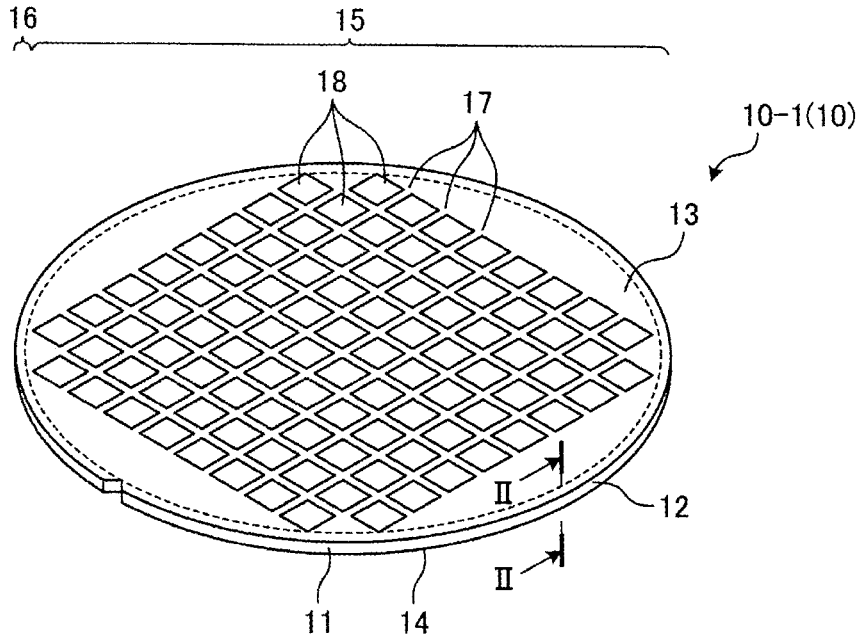
FIG. 1 is a perspective view illustrating one example of a wafer that is a processing target of a processing method of the wafer according to an embodiment.
Figure 2:
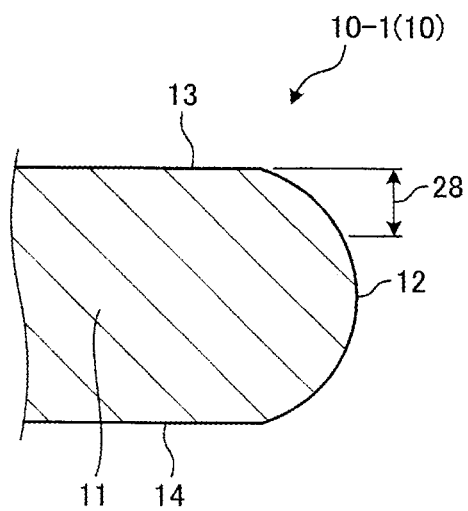
FIG. 2 is a sectional view along line II-II illustrated in FIG. 1.

A processing method of a wafer 10 according to the embodiment of the present invention will be described based on drawings. FIG. 1 is a perspective view illustrating one example of the wafer 10 that is a processing target of the processing method of the wafer 10 according to the embodiment. FIG. 2 is a sectional view along line II-II illustrated in FIG. 1.

The wafer 10 illustrated in FIG. 1 and FIG. 2 is a wafer such as a circular plate-shaped semiconductor wafer or optical device wafer having silicon (Si), sapphire (Al$_2$O$_3$), gallium arsenide (GaAs), silicon carbide (SiC), or the like as a substrate 11, and is a silicon wafer in the embodiment. In the wafer 10, as illustrated in FIG. 2, an outer circumferential edge 12 is chamfered in such a manner that the center in the thickness direction protrudes to the outer circumferential side most and a section of the wafer 10 has a circular arc shape from a front surface 13 to a back surface 14 of the substrate 11. The thickness of the wafer 10 of the embodiment is 775 μm.

As illustrated in FIG. 1, the wafer 10 includes a device region 15 and an outer circumferential surplus region 16 that surrounds the device region 15 on the side of the front surface 13 of the substrate 11. The device region 15 has multiple planned dividing lines 17 set in a lattice manner in the front surface 13 of the substrate 11 and devices 18 formed in the respective regions marked out by the planned dividing lines 17. The outer circumferential surplus region 16 is a region that surrounds the device region 15 across the whole circumference and in which the device 18 is not formed.

In the embodiment, the devices 18 configure a 3D NAND flash memory and include an electrode pad and a through-electrode that connects to the electrode pad. The through-electrode penetrates to the side of the back surface 14 of the substrate 11 when the substrate 11 is thinned and the devices 18 are individually divided from the wafer 10. That is, the wafer 10 of the embodiment is a generally-called TSV wafer in which the devices 18 individually divided have the through-electrode. The wafer 10 of the present invention is not limited to the TSV wafer having the through-electrode as in the embodiment and may be a device wafer without the through-electrode.

Figure 3:
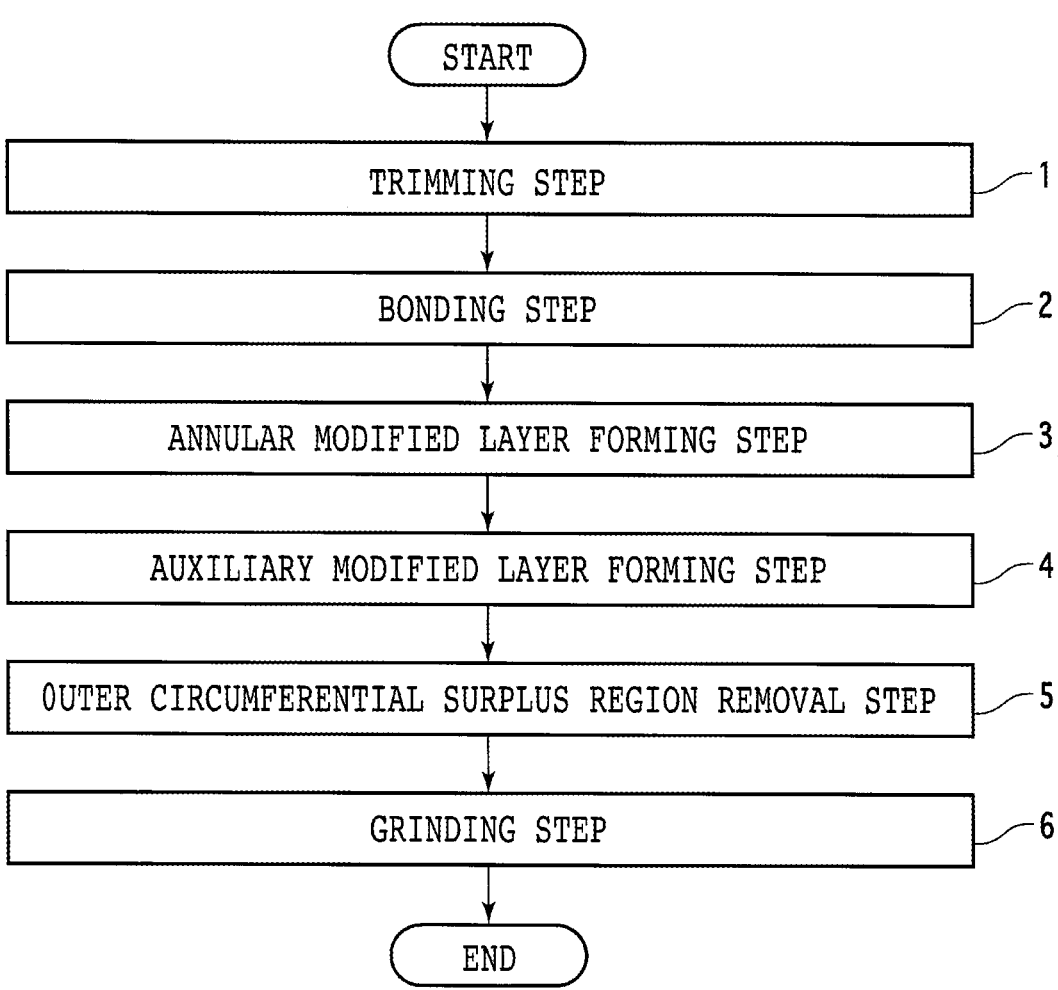
FIG. 3 is a flowchart illustrating the flow of the processing method of the wafer according to the embodiment.

FIG. 3 is a flowchart illustrating the flow of the processing method of the wafer 10 according to the embodiment. As illustrated in FIG. 3, the processing method of the wafer 10 in the embodiment includes a trimming step 1, a bonding step 2, an annular modified layer forming step 3, an auxiliary modified layer forming step 4, an outer circumferential surplus region removal step 5, and a grinding step 6. The processing method of the wafer 10 in the embodiment is a method in which the sides of the front surfaces 13 of a pair of wafers 10 are bonded to each other and one wafer 10 (first wafer 10-1) is thinned to a predetermined finished thickness 28.

In the following description, when the wafers 10 in the pair of wafers 10 are differentiated from each other, the one wafer 10 will be represented as the first wafer 10-1 and the other wafer 10 will be represented as a second wafer 10-2 (see FIG. 5). When being not differentiated, they will be represented as the wafer 10 simply. Description will be made based on the assumption that the second wafer 10-2 that is not thinned is a TSV wafer similar to the first wafer 10-1 in the embodiment. However, the second wafer 10-2 may be a mere substrate wafer without a pattern in the present invention.

(Trimming Step 1)

Figure 4:
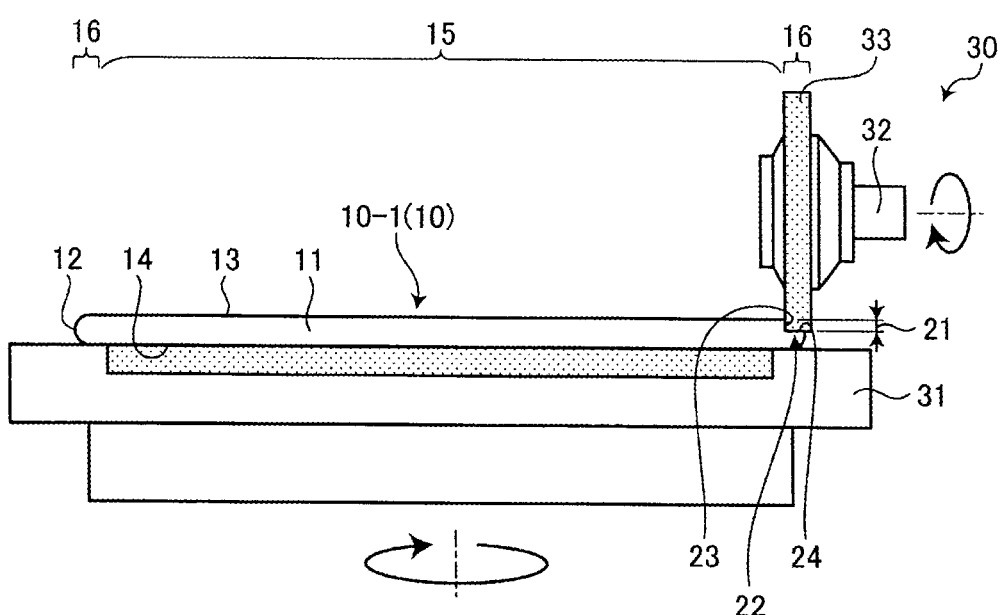
FIG. 4 is a partially sectional side view illustrating a trimming step illustrated in FIG. 3.

FIG. 4 is a partially sectional side view illustrating the trimming step 1 illustrated in FIG. 3. The trimming step 1 is a step of causing a cutting blade 33 to cut into the first wafer 10-1 from the side of the front surface 13 of the first wafer 10-1 by a predetermined thickness 21 and executing cutting along the outer circumferential edge 12 of the first wafer 10-1 to form an annular step part 22 in the outer circumferential surplus region 16. In the trimming step 1, by a cutting apparatus 30, the outer circumferential surplus region 16 is annularly cut by the predetermined thickness 21 to form the annular step part 22.

The cutting apparatus 30 includes a holding table 31, a spindle 32, and the cutting blade 33. The holding table 31 sucks and holds the first wafer 10-1 on a holding surface (upper surface). The holding table 31 can rotate around the vertical axial center. The spindle 32 is a shaft component that rotates around the horizontal axial center. The cutting blade 33 includes a circular annular cutting abrasive stone and is mounted on the spindle 32 with the axial center thereof corresponding with the axial center of the spindle 32. The cutting apparatus 30 further includes a movement unit that relatively moves the holding table 31 and the cutting blade 33 and is not illustrated, an imaging unit that is not illustrated, and a cutting water supply unit that supplies cutting water to a processing point of the cutting blade 33 and is not illustrated.

In the trimming step 1, first, the side of the back surface 14 of the first wafer 10-1 is sucked and held on the holding surface of the holding table 31. Next, position adjustment between the first wafer 10-1 and the cutting blade 33 is executed. Specifically, the holding table 31 is moved to a processing region below the cutting blade 33 by the movement unit that is not illustrated. Subsequently, by photographing the first wafer 10-1 by the imaging unit that is not illustrated and executing alignment, position adjustment of the processing point of the cutting blade 33 to the outer circumferential surplus region 16 of the first wafer 10-1 is executed.

In the trimming step 1, next, supply of the cutting water toward the front surface 13 of the first wafer 10-1 is started by the cutting water supply unit that is not illustrated. Subsequently, the cutting blade 33 is caused to cut into the first wafer 10-1 by the movement unit that is not illustrated and the holding table 31 is rotated around the vertical axial center. Then, the cutting blade 33 is caused to cut into the first wafer 10-1 to the predetermined thickness 21 from the side of the front surface 13 of the first wafer 10-1 and the outer circumferential surplus region 16 corresponding to the predetermined thickness 21 is cut and removed. The predetermined thickness 21 is approximately 150 μm in the embodiment.

The step part 22 having the predetermined thickness 21 as the height thereof is formed in the outer circumferential surplus region 16 of the first wafer 10-1. The step part 22 includes a vertical surface 23 and a horizontal surface 24. The vertical surface 23 is formed on the inner circumferential side relative to the outer circumferential edge 12 of the first wafer 10-1 and in the direction orthogonal to the front surface 13 from the side of the front surface 13. The horizontal surface 24 is formed in parallel to the front surface 13 from the end of the vertical surface 23 on the side of the back surface 14 toward the outer circumferential edge 12. The step part 22 is annularly formed through formation of the vertical surface 23 and the horizontal surface 24 across the whole circumference of the first wafer 10-1.

(Bonding Step 2)

Figure 5:
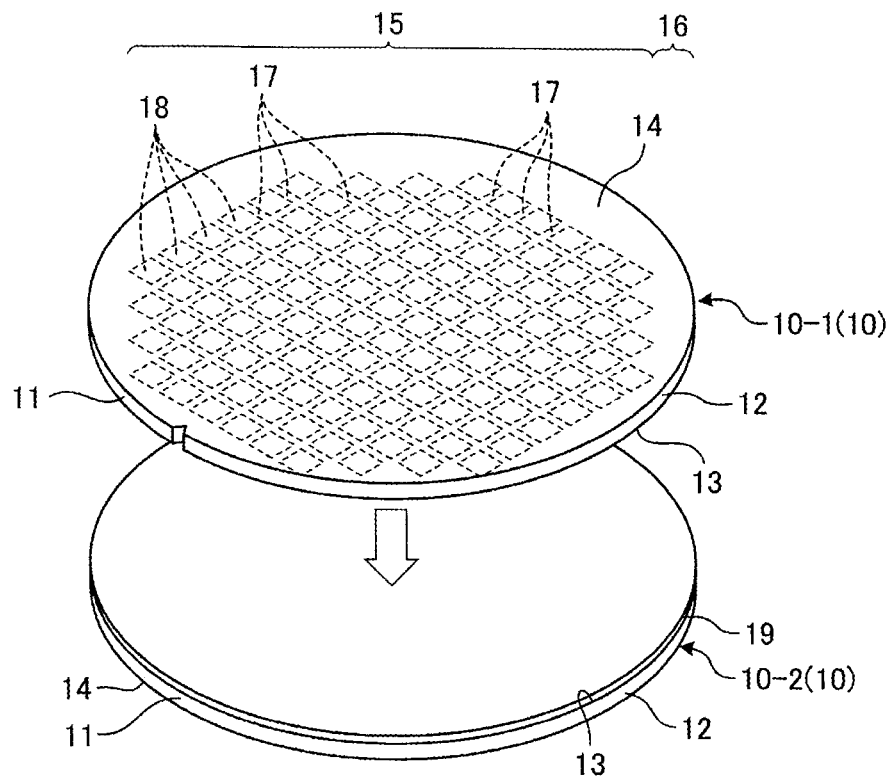
FIG. 5 is a perspective view illustrating one state of a bonding step illustrated in FIG. 3.
Figure 6:
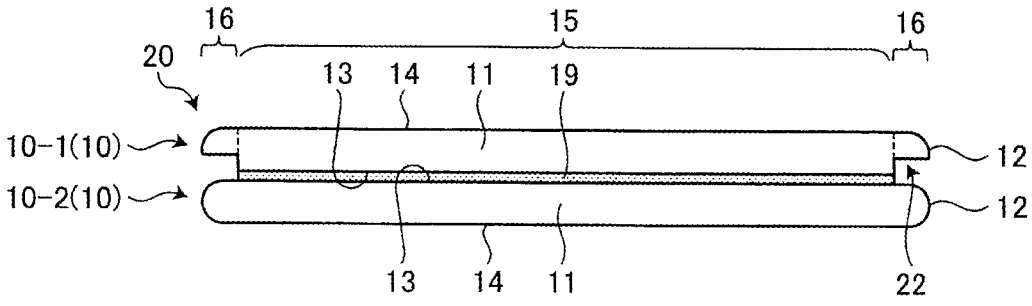
FIG. 6 is a sectional view illustrating a bonded wafer after the bonding step illustrated in FIG. 3.

FIG. 5 is a perspective view illustrating one state of the bonding step 2 illustrated in FIG. 3. FIG. 6 is a sectional view illustrating a bonded wafer 20 after the bonding step 2 illustrated in FIG. 3. The bonding step 2 is executed after the trimming step 1 is executed. The bonding step 2 is a step of bonding the side of the front surface 13 of the first wafer 10-1 and the side of the front surface 13 of the second wafer 10-2 to form the bonded wafer 20.

In the bonding step 2, first, as illustrated in FIG. 5, a joining layer 19 is stacked on one of the front surface 13 of the first wafer 10-1 and the front surface 13 of the second wafer 10-2. In the embodiment, the joining layer 19 is stacked on the front surface 13 of the second wafer 10-2. The joining layer 19 is a double-sided tape in which an adhesive layer is stacked on front and back surfaces of a base layer in the embodiment. However, the joining layer 19 is not limited to the double-sided tape in the present invention and may be for example an oxide film or what is formed by applying of an adhesive containing a resin or the like. Furthermore, the first wafer 10-1 and the second wafer 10-2 may be directly joined without using the joining layer 19.

In the bonding step 2, next, as illustrated in FIG. 5, the front surface 13 of the first wafer 10-1 is opposed to the joining layer 19 stacked on the side of the front surface 13 of the second wafer 10-2 at an interval. Next, as illustrated in FIG. 6, the front surface 13 of the first wafer 10-1 and the front surface 13 of the second wafer 10-2 are bonded with the interposition of the joining layer 19. This forms the bonded wafer 20. In the bonded wafer 20, the step part 22 formed in the trimming step 1 is opposed to the side of the second wafer 10-2.

(Annular Modified Layer Forming Step 3)

Figure 7:
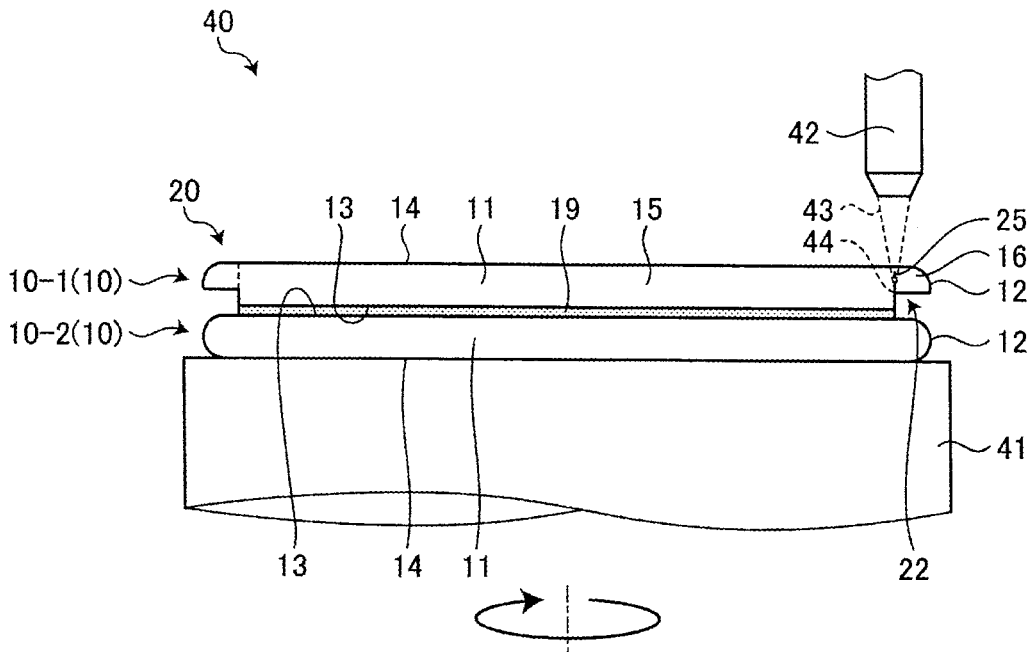
FIG. 7 is a partially sectional side view illustrating an annular modified layer forming step illustrated in FIG. 3.

FIG. 7 is a partially sectional side view illustrating the annular modified layer forming step 3 illustrated in FIG. 3. The annular modified layer forming step 3 is executed after the bonding step 2 is executed. The annular modified layer forming step 3 is a step of forming an annular modified layer 25 along the boundary between the device region 15 of the first wafer 10-1 and the outer circumferential surplus region 16 that has not been removed in the trimming step 1. The annular modified layer forming step 3 of the embodiment forms the annular modified layer 25 inside the first wafer 10-1 by stealth dicing by a laser processing apparatus 40.

The laser processing apparatus 40 includes a holding table 41 and a laser beam irradiation unit 42. The holding table 41 holds the wafer 10 on a holding surface and can rotate around the vertical axial center. The laser beam irradiation unit 42 irradiates the wafer 10 held by the holding table 41 with a laser beam 43. The laser processing apparatus 40 further includes a movement unit that relatively moves the holding table 41 and the laser beam irradiation unit 42 and is not illustrated, an imaging unit that images the wafer 10 held by the holding table 41 and is not illustrated, and so forth.

In the annular modified layer forming step 3, a modified layer (annular modified layer 25) that becomes the point of origin of splitting is formed by executing irradiation with the laser beam 43 along the boundary between the device region 15 and the outer circumferential surplus region 16. The boundary between the device region 15 and the outer circumferential surplus region 16 is at a position separate inward from the outer circumferential edge 12 by a predetermined distance and shows an annular shape in plan view. The laser beam 43 is a laser beam with a wavelength having transmissibility with respect to the first wafer 10-1 and is infrared rays (IR), for example.

The modified layer means a region in which the density, the refractive index, the mechanical strength, or another physical characteristic has become a state different from that of the surroundings. For example, the modified layer is a melting treatment region, a crack region, a dielectric breakdown region, a refractive index change region, a region in which these regions exist in a mixed manner, and so forth. In the modified layer, the mechanical strength and so forth are lower than those of the other part in the first wafer 10-1.

In the annular modified layer forming step 3, first, the side of the back surface 14 of the second wafer 10-2 is sucked and held on the holding surface (upper surface) of the holding table 41. Next, position adjustment between the first wafer 10-1 and a light collector of the laser beam irradiation unit 42 is executed. Specifically, the holding table 41 is moved to an irradiation region below the laser beam irradiation unit 42 by the movement unit that is not illustrated. Subsequently, by photographing the first wafer 10-1 by the imaging unit that is not illustrated and executing alignment, an irradiation part of the laser beam irradiation unit 42 is made opposed to the boundary between the device region 15 and the outer circumferential surplus region 16 in the vertical direction. Thereafter, a focal point 44 of the laser beam 43 is set inside the first wafer 10-1.

In the annular modified layer forming step 3, next, while the holding table 41 is rotated around the vertical axial center, irradiation with the laser beam 43 from the laser beam irradiation unit 42 is executed from the side of the back surface 14 of the first wafer 10-1. That is, irradiation with the laser beam 43 is executed along the boundary between the device region 15 and the outer circumferential surplus region 16 of the first wafer 10-1 and an annularly continuous modified layer (annular modified layer 25) is formed.

At this time, in the annular modified layer forming step 3, multiple annular modified layers 25 are formed in the thickness direction of the first wafer 10-1 by executing irradiation with the laser beam 43 multiple times with change in the height of the focal point 44 of the laser beam 43 or executing irradiation with the laser beam 43 having multiple focal points 44 separate in the thickness direction of the first wafer 10-1. Cracks extend from the annular modified layers 25 and the point of origin of dividing is formed between the side of the device region 15 of the first wafer 10-1 and the side of the outer circumferential surplus region 16 that has not been removed in the trimming step 1 due to coupling of the annular modified layers 25 and the cracks.

(Auxiliary Modified Layer Forming Step 4)

Figure 8:
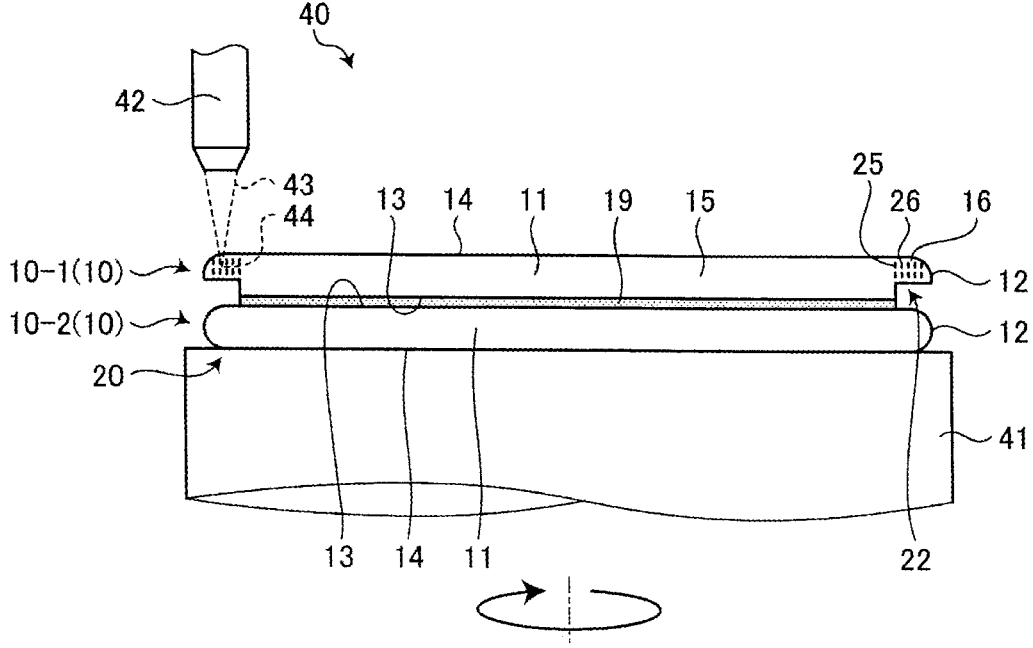
FIG. 8 is a partially sectional side view illustrating an auxiliary modified layer forming step illustrated in FIG. 3.
Figure 9:
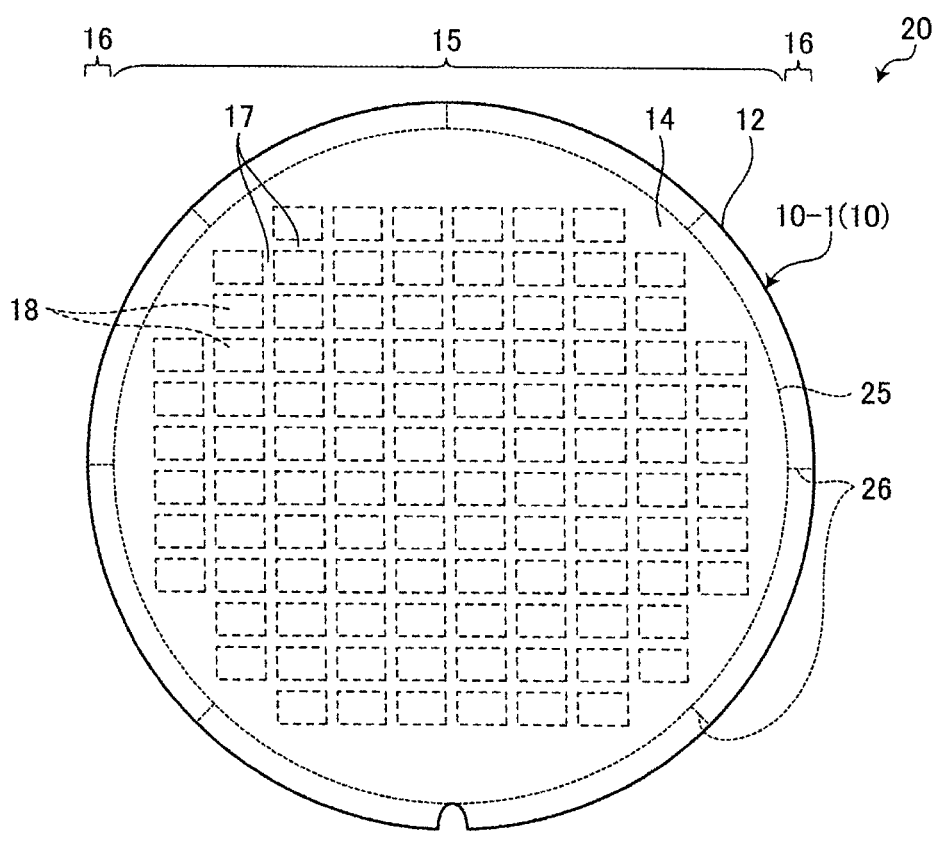
FIG. 9 is a plan view illustrating one example of the bonded wafer after the auxiliary modified layer forming step illustrated in FIG. 3.

FIG. 8 is a partially sectional side view illustrating the auxiliary modified layer forming step 4 illustrated in FIG. 3. FIG. 9 is a plan view illustrating one example of the bonded wafer 20 after the auxiliary modified layer forming step 4 illustrated in FIG. 3. The auxiliary modified layer forming step 4 is executed before the grinding step 6. The auxiliary modified layer forming step 4 is a step of forming an auxiliary modified layer 26 that segments the outer circumferential surplus region 16 of the first wafer 10-1 on the side of the outer circumferential edge 12 relative to the annular modified layers 25 into at least two regions. The auxiliary modified layer forming step 4 of the embodiment forms the auxiliary modified layer 26 inside the first wafer 10-1 by stealth dicing by the laser processing apparatus 40.

In one example of the auxiliary modified layer forming step 4, for example, as illustrated in FIG. 9, the auxiliary modified layers 26 in a radial manner are formed in the outer circumferential surplus region 16 of the first wafer 10-1 on the side of the outer circumferential edge 12 relative to the annular modified layers 25. That is, at predetermined positions in the circumferential direction in the outer circumferential surplus region 16 of the first wafer 10-1, the auxiliary modified layers 26 that become the point of origin of separation are formed in the radial direction between the inner circumferential edge of the outer circumferential surplus region 16 and the outer circumferential edge 12.

In the auxiliary modified layer forming step 4, first, the irradiation part of the laser beam irradiation unit 42 is made opposed to the predetermined position in the circumferential direction in the outer circumferential surplus region 16 by executing alignment between the first wafer 10-1 and the laser beam irradiation unit 42. Thereafter, the focal point 44 of the laser beam 43 is set inside the first wafer 10-1.

Next, while the holding table 41 and the laser beam irradiation unit 42 are relatively moved by the movement unit that is not illustrated, irradiation with the laser beam 43 from the laser beam irradiation unit 42 is executed from the side of the back surface 14 of the first wafer 10-1. At this time, the holding table 41 is moved to cause the focal point 44 of the laser beam 43 to move toward the outside in the radial direction of the first wafer 10-1. That is, the auxiliary modified layer 26 continuous in the radial direction is formed by irradiating the outer circumferential surplus region 16 with the laser beam 43 in the radial direction.

In the auxiliary modified layer forming step 4 illustrated in FIG. 9, the outer circumferential surplus region 16 is divided into eight regions in the circumferential direction. However, in the present invention, for example, the number of divisions may be further doubled, that is, the outer circumferential surplus region 16 may be divided into 16 regions, or the number of divisions may be set as appropriate according to dimensions such as a diameter of the first wafer 10-1 and a width of the outer circumferential surplus region 16. Furthermore, in the above description, irradiation with the laser beam 43 is executed while the holding table 41 is moved to cause the focal point 44 to move from the inside in the radial direction of the first wafer 10-1 toward the outside in the radial direction. However, in the present invention, irradiation with the laser beam 43 may be executed while the holding table 41 is moved to cause the focal point 44 to move from the outside in the radial direction of the first wafer 10-1 toward the inside in the radial direction. In this case, the irradiation with the laser beam 43 is stopped at the timing when the focal point 44 has reached the annular modified layer 25.

Figure 10:
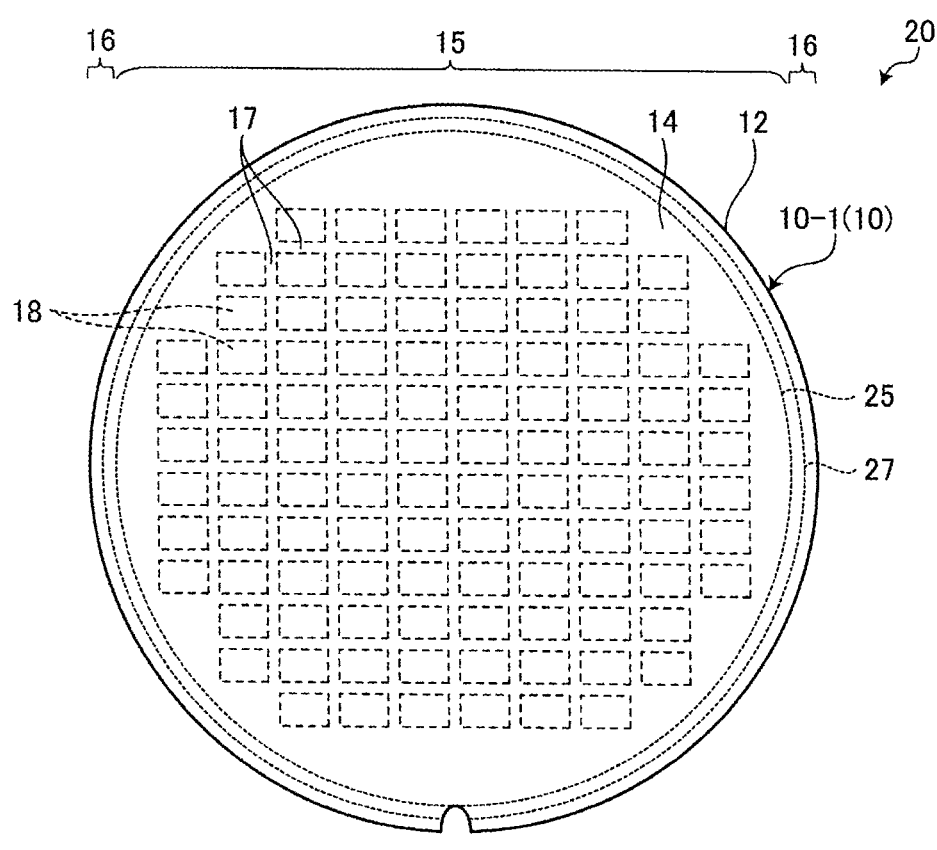
FIG. 10 is a plan view illustrating another example of the bonded wafer after the auxiliary modified layer forming step illustrated in FIG. 3.

FIG. 10 is a plan view illustrating another example of the bonded wafer 20 after the auxiliary modified layer forming step 4 illustrated in FIG. 3. That is, in the auxiliary modified layer forming step 4, an auxiliary modified layer 27 with a shape of a circle concentric with the annular modified layers 25 may be formed instead of the radial auxiliary modified layer 26. In the case of forming such an annular auxiliary modified layer 27, the auxiliary modified layer forming step 4 can be executed in almost the same procedure as the annular modified layer forming step 3.

That is, the irradiation part of the laser beam irradiation unit 42 is made opposed to a predetermined position on the side of the outer circumferential edge 12 relative to the annular modified layers 25 by executing alignment between the first wafer 10-1 and the laser beam irradiation unit 42. Thereafter, the focal point 44 of the laser beam 43 is set inside the first wafer 10-1.

Next, similarly to the annular modified layer forming step 3, while the holding table 41 is rotated around the vertical axial center, irradiation with the laser beam 43 from the laser beam irradiation unit 42 is executed from the side of the back surface 14 of the first wafer 10-1. This forms the annularly continuous auxiliary modified layer 27 with the shape of a circle concentric with the annular modified layers 25 on the side of the outer circumferential edge 12 relative to the annular modified layers 25.

In the auxiliary modified layer forming step 4, similarly to the annular modified layer forming step 3, multiple auxiliary modified layers 26 or 27 may be formed in the thickness direction of the first wafer 10-1 by executing irradiation with the laser beam 43 multiple times with change in the height of the focal point 44 of the laser beam 43 or executing irradiation with the laser beam 43 having multiple focal points 44 separate in the thickness direction of the first wafer 10-1. Furthermore, in the auxiliary modified layer forming step 4, the auxiliary modified layer is not limited to the radial auxiliary modified layer 26 illustrated in FIG. 9 and the auxiliary modified layer 27 that is illustrated in FIG. 10 and has the shape of a circle concentric with the annular modified layers 25. For example, an auxiliary modified layer that extends in a tangential direction may be formed or may be formed through combining multiple kinds of auxiliary modified layers 26 and 27.

Cracks extend from the auxiliary modified layer 26 or 27 and the point of origin of dividing that segments the outer circumferential surplus region 16 that has not been removed in the trimming step 1 in the first wafer 10-1 into at least two regions is formed due to coupling of the auxiliary modified layer 26 or 27 and the cracks. In the processing method of the wafer 10, the auxiliary modified layer 26 or 27 does not necessarily need to be formed and the auxiliary modified layer forming step 4 may be omitted.

(Outer Circumferential Surplus Region Removal Step 5)

Figure 11:
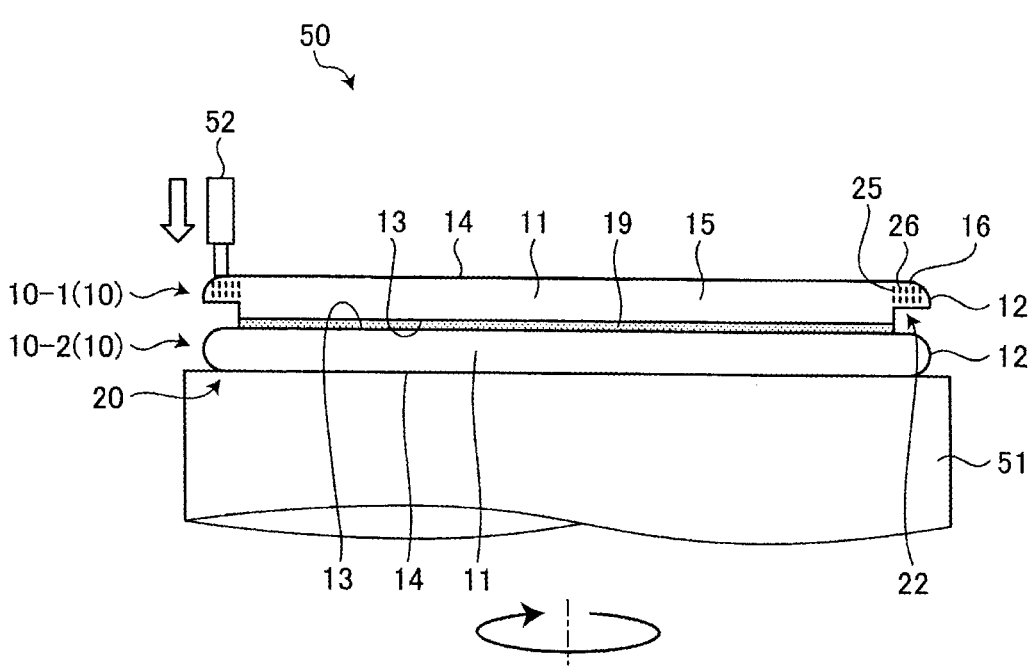
FIG. 11 is a partially sectional side view illustrating one example of an outer circumferential surplus region removal step illustrated in FIG. 3.

FIG. 11 is a partially sectional side view illustrating one example of the outer circumferential surplus region removal step 5 illustrated in FIG. 3. The outer circumferential surplus region removal step 5 is executed before the grinding step 6. The outer circumferential surplus region removal step 5 is a step of giving an external force to the outer circumferential surplus region 16 of the first wafer 10-1 that has not been removed in the trimming step 1 and removing the outer circumferential surplus region 16 with use of the annular modified layers 25 as the point of origin. The outer circumferential surplus region removal step 5 of the embodiment removes the outer circumferential surplus region 16 by giving a shear force in the thickness direction of the first wafer 10-1 by an external force giving apparatus 50 illustrated in FIG. 11.

The external force giving apparatus 50 includes a holding table 51 and a pressed component 52. The holding table 51 holds the wafer 10 on a holding surface and can rotate around the vertical axial center. The pressed component 52 can move in the upward-downward direction relative to the holding table 51 and gives an external force by being pressed against the wafer 10 held by the holding table 51 from the upper side. The external force giving apparatus 50 further includes a movement unit that relatively moves the holding table 51 and the pressed component 52 and is not illustrated.

In the outer circumferential surplus region removal step 5, first, the side of the back surface 14 of the second wafer 10-2 is sucked and held on the holding surface (upper surface) of the holding table 51. Next, position adjustment between the first wafer 10-1 and the pressed component 52 is executed. Specifically, by the movement unit that is not illustrated, the holding table 51 is moved to the lower side of the pressed component 52 and the pressed component 52 is made opposed to the outer circumferential surplus region 16 of the first wafer 10-1 in the vertical direction.

In the outer circumferential surplus region removal step 5, next, the pressed component 52 is lowered downward and the pressed component 52 is pressed against the outer circumferential surplus region 16 of the first wafer 10-1. Thereby, an external force in the downward direction is given to the outer circumferential surplus region 16 by the pressed component 52. Thereupon, the device region 15 and the outer circumferential surplus region 16 are divided with the annular modified layers 25 and the auxiliary modified layer 26 being the point of origin, and the outer circumferential surplus region 16 of the first wafer 10-1 is removed.

Figure 12:
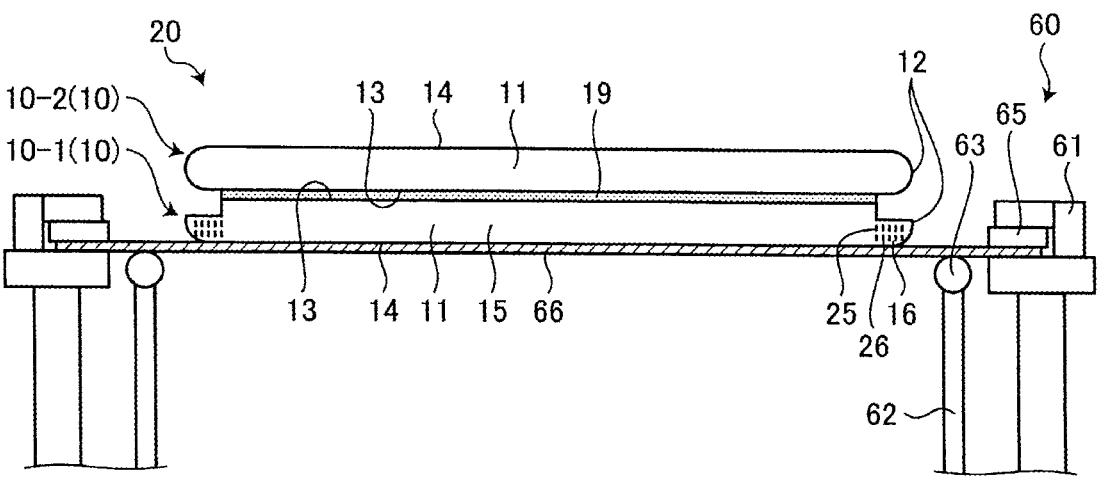
FIG. 12 is a partially sectional side view illustrating another example of the outer circumferential surplus region removal step illustrated in FIG. 3.
Figure 13:
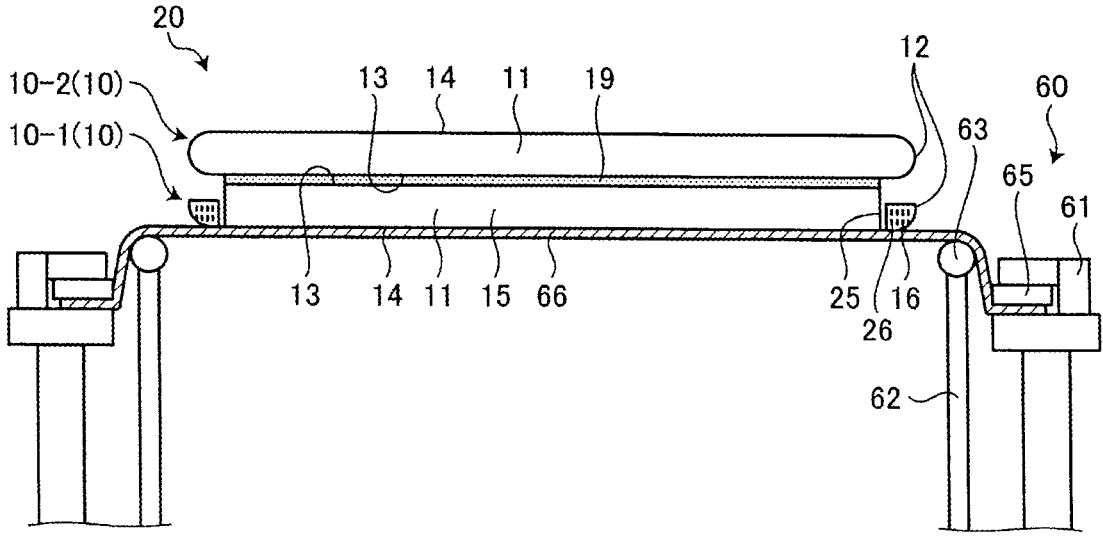
FIG. 13 is a partially sectional side view illustrating a state after FIG. 12 in the other example of the outer circumferential surplus region removal step illustrated in FIG. 3.

FIG. 12 is a partially sectional side view illustrating another example of the outer circumferential surplus region removal step 5 illustrated in FIG. 3. FIG. 13 is a partially sectional side view illustrating a state after FIG. 12 in the other example of the outer circumferential surplus region removal step 5 illustrated in FIG. 3. In the outer circumferential surplus region removal step 5 illustrated in FIG. 12 and FIG. 13, the outer circumferential surplus region 16 is removed by giving a radial external force to the first wafer 10-1 with use of an expanding apparatus 60. The expanding apparatus 60 of the embodiment includes clamp components 61, pushing-up components 62, and roller components 63.

In the outer circumferential surplus region removal step 5, the bonded wafer 20 is fixed to an annular frame 65 and an expanding tape 66 in advance. The frame 65 is an annular plate component that is formed of a metal or resin and has an opening larger than the outer diameter of the first wafer 10-1. The expanding tape 66 is a sheet-shaped component that has expandability and has an outer diameter larger than the opening of the frame 65. The expanding tape 66 is stuck to the back surface side of the frame 65 to cover the opening of the frame 65. The bonded wafer 20 is positioned to a predetermined position in the opening of the frame 65 and the side of the back surface 14 of the first wafer 10-1 is stuck to the expanding tape 66. Thereby, the bonded wafer 20 is fixed to the frame 65 and the expanding tape 66.

In the outer circumferential surplus region removal step 5, first, as illustrated in FIG. 12, an outer circumferential part of the frame 65 is fixed by the clamp components 61 in the state in which the side of the back surface 14 of the first wafer 10-1 is oriented downward. At this time, the roller components 63 abut against the expanding tape 66 between the inner circumferential edge of the frame 65 and the outer circumferential edge 12 of the first wafer 10-1.

In the outer circumferential surplus region removal step 5, next, as illustrated in FIG. 13, the pushing-up components 62 are integrally raised. Because an outer circumferential part of the expanding tape 66 is fixed by the clamp components 61 with the interposition of the frame 65, a part in the expanding tape 66 between the inner circumferential edge of the frame 65 and the outer circumferential edge of the device region 15 of the first wafer 10-1, that is, the part at which the annular modified layers 25 are formed, is expanded in the surface direction. At this time, the roller components 63 disposed at the upper ends of the pushing-up components 62 alleviate friction with the expanding tape 66 and therefore the whole of the expanding tape 66 is expanded in surface direction.

When a tensile force radially acts on the expanding tape 66 as the result of the expansion of the expanding tape 66, as illustrated in FIG. 13, the outer circumferential surplus region 16 is divided from the device region 15 with the annular modified layers 25 formed between the device region 15 and the outer circumferential surplus region 16 of the first wafer 10-1 being the point of origin of separation. At this time, the outer circumferential surplus region 16 is divided into multiple regions in the circumferential direction with the auxiliary modified layer 26 radially formed being the point of origin of separation.

In the processing method of the wafer 10, the outer circumferential surplus region 16 that has not been removed in the trimming step 1 in the first wafer 10-1 does not necessarily need to be removed before the grinding step 6, and the outer circumferential surplus region removal step 5 may be omitted.

(Grinding Step 6)

Figure 14:
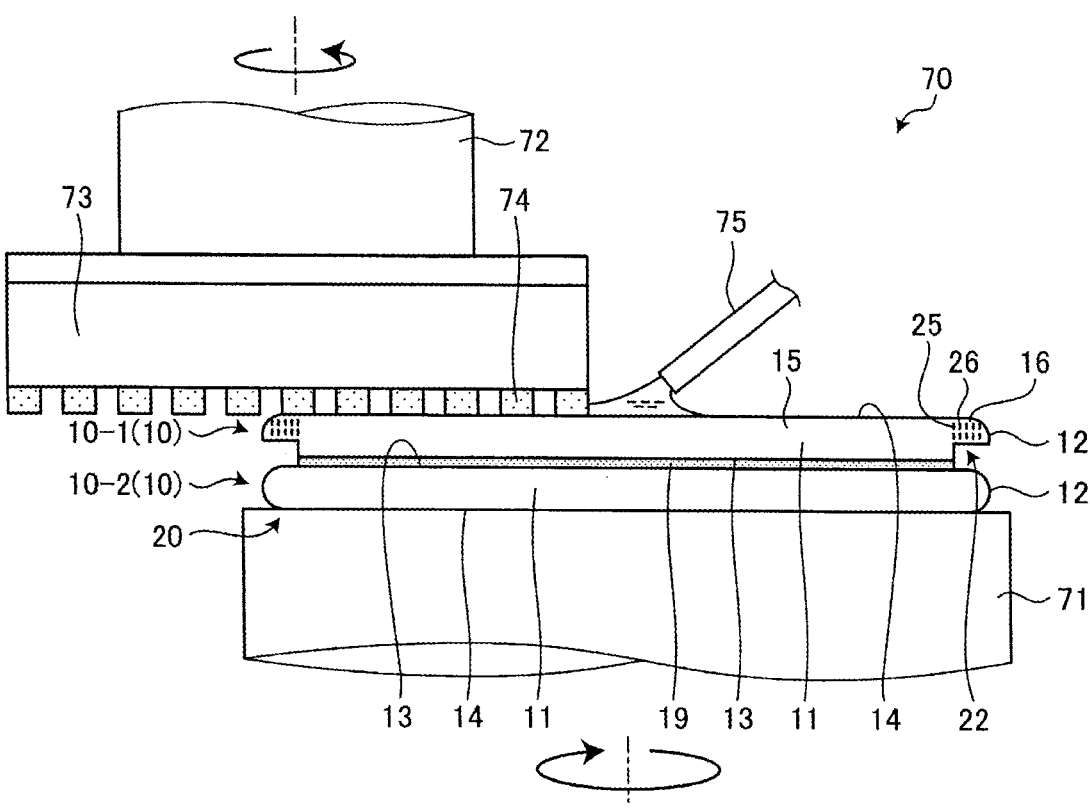
FIG. 14 is a partially sectional side view illustrating a grinding step illustrated in FIG. 3.
Figure 15:
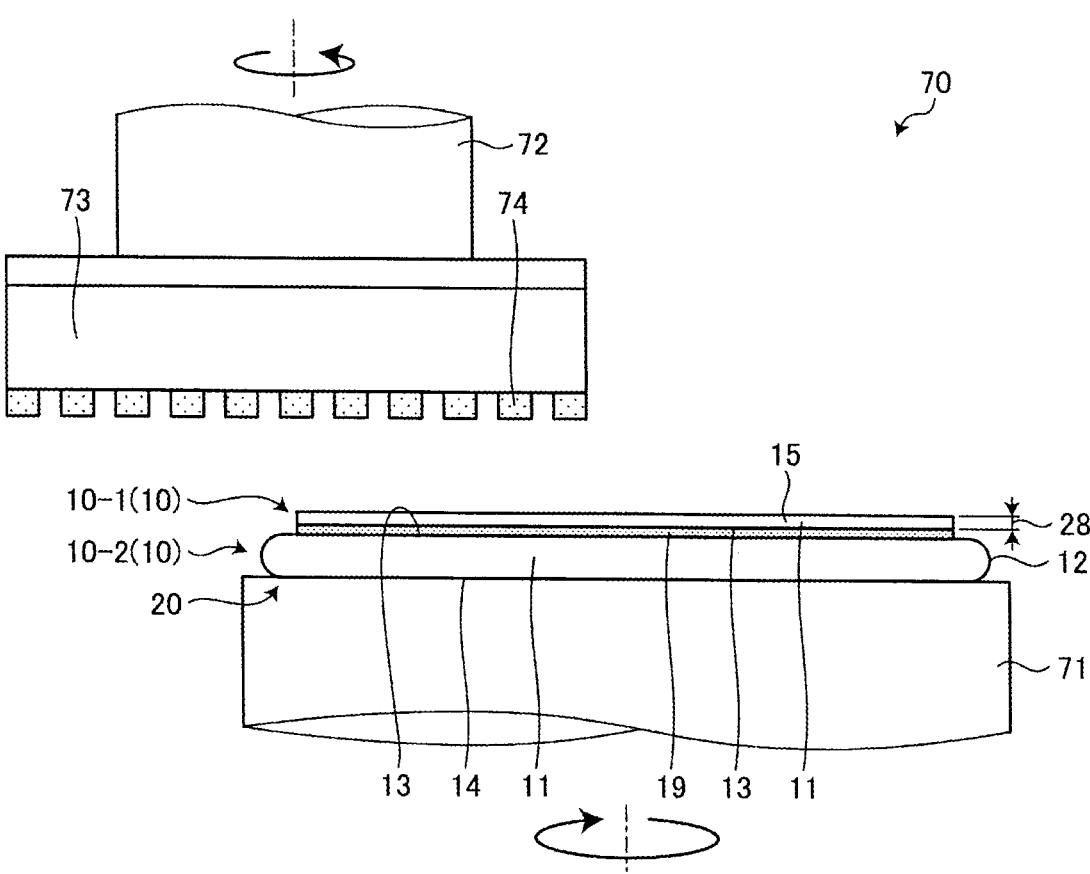
FIG. 15 is a partially sectional side view illustrating a state after FIG. 14 in the grinding step illustrated in FIG. 3.

FIG. 14 is a partially sectional side view illustrating the grinding step 6 illustrated in FIG. 3. FIG. 15 is a partially sectional side view illustrating a state after FIG. 14 in the grinding step 6 illustrated in FIG. 3. The grinding step 6 is executed after the annular modified layer forming step 3 is executed. The grinding step 6 is a step of grinding the side of the back surface 14 of the first wafer 10-1 to execute thinning to the predetermined finished thickness 28.

In the processing method of the wafer 10, in the case of executing the auxiliary modified layer forming step 4 and the outer circumferential surplus region removal step 5, the grinding step 6 is executed later than them. FIG. 14 illustrates the case in which the auxiliary modified layer forming step 4 has been executed and the outer circumferential surplus region removal step 5 has not been executed and the grinding step 6 is executed in the state in which the outer circumferential surplus region 16 of the first wafer 10-1 remains.

In the grinding step 6, the side of the back surface 14 of the first wafer 10-1 is ground to execute thinning to the predetermined finished thickness 28 by a grinding apparatus 70. The grinding apparatus 70 includes a holding table 71, a spindle 72 that is a rotating shaft component, a grinding wheel 73 attached to the lower end of the spindle 72, grinding abrasive stones 74 mounted on the lower surface of the grinding wheel 73, and a grinding water supply unit 75.

The grinding wheel 73 rotates with a rotation axis parallel to the axial center of the holding table 71.

In the grinding step 6, first, the side of the back surface 14 of the second wafer 10-2 is sucked and held on a holding surface of the holding table 71. Next, the grinding wheel 73 is rotated around the axial center in the state in which the holding table 71 is rotated around the axial center. By supplying grinding water to a processing point by the grinding water supply unit 75 and bringing the grinding abrasive stones 74 of the grinding wheel 73 closer to the holding table 71 at a predetermined feed rate, the back surface 14 of the first wafer 10-1 is ground by the grinding abrasive stones 74 to execute thinning to the predetermined finished thickness 28. At this time, the outer circumferential surplus region 16 of the first wafer 10-1 is removed due to a grinding load.

As described above, in the processing method of the wafer 10 according to the embodiment, generally-called half cut in which the cutting blade 33 is caused to cut into the outer circumferential surplus region 16 of the first wafer 10-1 from the side of the front surface 13 by the predetermined thickness 21 is executed and thereafter the side of the front surface 13 on which the half cut has been executed and the second wafer 10-2 that is a support substrate are bonded. Then, the annular modified layers (annular modified layers 25) are formed for the boundary between the outer circumferential surplus region 16 that remains without being subjected to the half cut and the device region 15 and thereafter grinding of the side of the back surface 14 of the first wafer 10-1 is executed.

Therefore, in the grinding, the step part 22 due to the half cut is formed directly under the outer circumferential surplus region 16 that remains. This can eliminate the problem that it is impossible to remove the region on the side of the outer circumferential edge 12 relative to the annular modified layers 25 well because of joining of this region, and the risk of breakage of the wafer 10 can be suppressed. Moreover, the processing method of the wafer 10 according to the embodiment provides an effect that uneven wear of the abrasive stone and the amount of consumption thereof can be reduced because the volume of removal by the cutting blade 33 is small and furthermore it becomes possible to reduce also contamination of the devices 18 due to scattering of a large amount of cutting dust.

Furthermore, in the case of removing the region on the side of the outer circumferential edge 12 relative to the annular modified layers 25 in the first wafer 10-1 by the outer circumferential surplus region removal step 5 before the grinding step 6, remaining of mill ends in the grinding chamber is further suppressed and contribution to reduction in the man-hours of cleaning and so forth can be achieved.

The present invention is not limited to the above-described embodiment. That is, the present invention can be carried out with various modifications without departing from the gist of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a wafer, the processing method comprising:

a trimming step of causing a cutting blade to cut into an outer circumferential surplus region of a first wafer having, on a front surface side, a device region in which a plurality of devices are formed and the outer circumferential surplus region that surrounds the device region from the front surface side of the first wafer by a predetermined thickness and executing cutting along an outer circumferential edge of the first wafer to form an annular step part in the outer circumferential surplus region;

a bonding step of bonding the front surface side of the first wafer and a front surface side of a second wafer to form a bonded wafer after the trimming step is executed;

an annular modified layer forming step of forming an annular modified layer along a boundary between the outer circumferential surplus region that has not been removed in the trimming step in the first wafer and the device region by positioning a focal point of a laser beam with a wavelength having transmissibility with respect to the first wafer to an inside of the first wafer and executing irradiation with the laser beam along the boundary between the device region and the outer circumferential surplus region from a back surface side of the first wafer after the bonding step is executed, such that the annular modified layer has a radius from a center of the first wafer which is the same as a radius of the vertical surface of the annular step part from the center of the first wafer; and a grinding step of grinding the back surface side of the first wafer to execute thinning to a predetermined finished thickness after the annular modified layer forming step is executed.

2. The processing method of a wafer according to claim 1, further comprising:

an outer circumferential surplus region removal step of giving an external force to the outer circumferential surplus region that has not been removed in the trimming step in the first wafer and removing the outer circumferential surplus region with use of the annular modified layer as a point of origin before the grinding step.

3. The processing method of a wafer according to claim 1, further comprising:

an auxiliary modified layer forming step of irradiating the outer circumferential surplus region on an outer circumferential edge side relative to the annular modified layer in the first wafer with a laser beam and forming an auxiliary modified layer that segments the outer circumferential surplus region into at least two regions before the grinding step.

4. The processing method of a wafer according to claim 3, wherein the auxiliary modified layer has a shape of a circle concentric with the annular modified layer.

5. The processing method of a wafer according to claim 3, wherein the auxiliary modified layer includes a plurality of auxiliary modified layers formed in a radial manner.

* * * * *